(12) United States Patent
Hara et al.

(10) Patent No.: US 12,104,950 B2
(45) Date of Patent: Oct. 1, 2024

(54) OPTICAL RECEIVER

(71) Applicant: SUMITOMO ELECTRIC INDUSTRIES, LTD., Osaka (JP)

(72) Inventors: Hiroshi Hara, Osaka (JP); Kosuke Okawa, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 18/259,598

(22) PCT Filed: Jan. 14, 2022

(86) PCT No.: PCT/JP2022/001119
§ 371 (c)(1),
(2) Date: Jun. 28, 2023

(87) PCT Pub. No.: WO2022/163391
PCT Pub. Date: Aug. 4, 2022

(65) Prior Publication Data
US 2024/0053196 A1 Feb. 15, 2024

(30) Foreign Application Priority Data

Jan. 26, 2021 (JP) .................................. 2021-010186

(51) Int. Cl.
*G01J 1/44* (2006.01)
*H03F 3/45* (2006.01)
(Continued)

(52) U.S. Cl.
CPC ............ *G01J 1/44* (2013.01); *H03F 3/45475* (2013.01); *H04B 10/60* (2013.01); *H04B 10/67* (2013.01);
(Continued)

(58) Field of Classification Search
CPC ........ G01J 1/44; H03F 3/45475; H04B 10/60; H04B 10/67; H05K 1/0231; H05K 1/181; H05K 2201/10121
See application file for complete search history.

(56) References Cited

U.S. PATENT DOCUMENTS

2006/0049338 A1* 3/2006 Sherazi ................. H04B 10/66
250/214 R
2015/0270814 A1 9/2015 Ban et al.
(Continued)

FOREIGN PATENT DOCUMENTS

CN 111865429 A 10/2020
JP 2007-274032 A 10/2007
(Continued)

OTHER PUBLICATIONS

International Search Report issued in Patent Application No. PCT/JP2022/001119 dated Mar. 8, 2022.

*Primary Examiner* — Thanh Luu
*Assistant Examiner* — Monica T Taba
(74) *Attorney, Agent, or Firm* — PEARNE & GORDON LLP

(57) ABSTRACT

An optical receiver according to one embodiment includes a transimpedance amplifier including a first pad, a second pad provided on an insulating layer, connected to a cathode wiring layer through a first via, arranged at a position interposing the first pad, and connected to a first cathode pad of a light-receiving element, and a third pad connected to the second cathode pad of the light-receiving element. The light-receiving element is connected to an anode pad mounted on the transimpedance amplifier and connected through an anode electrode and an anode wiring pattern provided on a surface facing the transimpedance amplifier and a first cathode pad and a second cathode pad connected (Continued)

through a cathode electrode and a cathode wiring pattern and arranged at positions interposing the anode pad.

7 Claims, 22 Drawing Sheets

(51) Int. Cl.
  *H04B 10/60* (2013.01)
  *H04B 10/67* (2013.01)
  *H05K 1/02* (2006.01)
  *H05K 1/18* (2006.01)
(52) U.S. Cl.
  CPC ........... *H05K 1/0231* (2013.01); *H05K 1/181* (2013.01); *H05K 2201/10121* (2013.01)

(56) References Cited

U.S. PATENT DOCUMENTS

| | | |
|---|---|---|
| 2019/0296175 A1 | 9/2019 | Takemura et al. |
| 2019/0319086 A1* | 10/2019 | Ainsworth ............ H01L 23/585 |
| 2019/0319594 A1 | 10/2019 | Nakayama et al. |

FOREIGN PATENT DOCUMENTS

| | | |
|---|---|---|
| JP | 2014-192510 A | 10/2014 |
| JP | 2019-186813 A | 10/2019 |
| WO | 2018/078788 A1 | 5/2018 |

* cited by examiner

OPTICAL RECEIVER

TECHNICAL FIELD

The present disclosure relates to optical receivers.

This application is based upon and claims the benefit of priority from Japanese Patent Application No. 2021-010186, filed Jan. 26, 2021, the entire contents of which are incorporated herein by reference.

BACKGROUND ART

Patent Literature 1 describes an optical receiver including a photodiode, a transimpedance amplifier, a differential output circuit, and an averaging circuit. The photodiode generates a photocurrent, and the transimpedance amplifier converts the photocurrent from the photodiode into a received signal, which is a voltage signal. The averaging circuit provides an average value of the received signal as a reference voltage to the differential output circuit. The differential output circuit generates a differential signal based on the received signal from the transimpedance amplifier and the reference voltage from the averaging circuit. The transimpedance amplifier has a gain varying unit for passively varying a conversion gain of the transimpedance amplifier according to a magnitude of the photocurrent. A time constant of the averaging circuit is variable according to an electrical control signal.

CITATION LIST

Patent Literature

Patent Literature 1: Japanese Unexamined Patent Publication No. 2007-274032

SUMMARY OF INVENTION

An optical receiver according to one embodiment includes a light-receiving element having an anode pad connected to an anode electrode through an anode wiring pattern and a first cathode pad and a second cathode pad connected to a cathode electrode through a cathode wiring pattern and arranged at positions interposing the anode pad. The optical receiver includes a transimpedance amplifier including a cathode wiring layer supplying a cathode potential to the cathode pad of the light-receiving element, an insulating layer having the cathode wiring layer therein, a first pad provided on the insulating layer and connected to the anode pad of the light-receiving element, and a second pad connected to the first cathode pad of the light-receiving element and a third pad connected to the second cathode pad of the light-receiving element provided on the insulating layer, connected to the cathode wiring layer through a first via, and arranged at positions interposing the first pad. The light-receiving element is connected to an anode pad mounted on the transimpedance amplifier and connected through an anode electrode and an anode wiring pattern provided on a surface facing the transimpedance amplifier and a first cathode pad and a second cathode pad connected through a cathode electrode and a cathode wiring pattern and arranged at positions interposing the anode pad.

DESCRIPTION OF EMBODIMENTS

Figure 1:
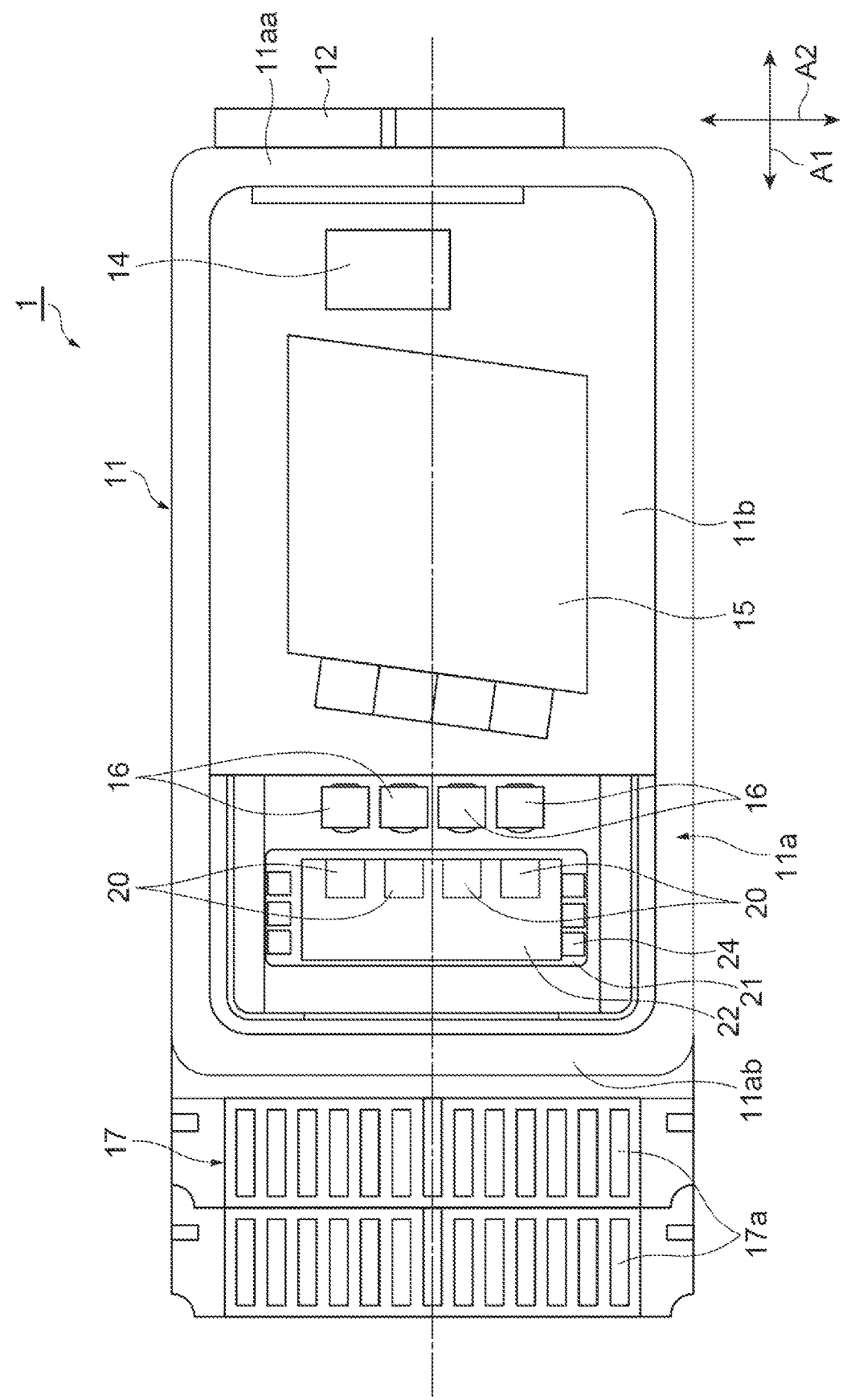
FIG. 1 is a plan view schematically illustrating an internal structure of an optical receiver.

By the way, it is required to shift a resonance frequency caused by parasitic capacitance or inductance between a light-receiving element (photodiode) and a transimpedance amplifier to a high frequency side. A method is known in which a plurality of wirings is arranged in parallel between the light-receiving element and the transimpedance amplifier to shift the resonance frequency to the high frequency side. However, the method of arranging the plurality of wirings in parallel may not sufficiently shift the resonance frequency to the high frequency side. Therefore, it is required to further shift the resonance frequency caused by the parasitic capacitance or the inductance to the higher frequency side.

An object of the present disclosure is to provide an optical receiver capable of shifting a resonance frequency caused by parasitic capacitance or inductance to a high frequency side.

DESCRIPTION OF EMBODIMENTS OF THE PRESENT DISCLOSURE

First, contents of the embodiments of the present disclosure will be listed and described. An optical receiver according to one embodiment includes a light-receiving element having an anode pad connected to an anode electrode through an anode wiring pattern and a first cathode pad and a second cathode pad connected to a cathode electrode through a cathode wiring pattern and arranged at positions interposing the anode pad. The optical receiver includes a transimpedance amplifier including a cathode wiring layer supplying a cathode potential to the cathode pad of the light-receiving element, an insulating layer having the cathode wiring layer therein, a first pad provided on the insulating layer and connected to the anode pad of the light-receiving element, and a second pad connected to the first cathode pad of the light-receiving element and a third pad connected to the second cathode pad of the light-receiving element provided on the insulating layer, connected to the cathode wiring layer through a first via, and arranged at positions interposing the first pad. The light-receiving element is connected to an anode pad mounted on the transimpedance amplifier and connected through an anode electrode and an anode wiring pattern provided on a surface facing the transimpedance amplifier and a first cathode pad and a second cathode pad connected through a cathode electrode and a cathode wiring pattern and arranged at positions interposing the anode pad.

In this optical receiver, a transimpedance amplifier includes a cathode wiring layer, a first pad, a second pad and a third pad. The light-receiving element includes an anode pad, a first cathode pad, and a second cathode pad. The light-receiving element is mounted on the transimpedance amplifier. In the transimpedance amplifier, the second pad and the third pad are arranged so as to interpose the first pad. In the light-receiving element, the first cathode pad and the second cathode pad are arranged so as to interpose the anode pad. The first pad of the transimpedance amplifier is connected to the anode pad of the light-receiving element. The second pad of the transimpedance amplifier is connected to the first cathode pad of the light-receiving element. The third pad of the transimpedance amplifier is connected to the second cathode pad of the light-receiving element. With the above configuration, a resonance frequency caused by parasitic capacitance or inductance can be shifted to a high frequency side. For example, a frequency of a resonant circuit existing in an RF current path between the light-receiving element and the transimpedance amplifier can be 100 GHz or higher.

The first pad of the transimpedance amplifier may be connected to the anode pad of the light-receiving element through a columnar member or a projection. The second pad of the transimpedance amplifier may be connected to the first cathode pad of the light-receiving element through a columnar member or a projection. The third pad of the transimpedance amplifier may be connected to the second cathode pad of the light-receiving element through a columnar member or a projection.

The transimpedance amplifier may further include a ground layer connected to a reference potential. The ground layer of the transimpedance amplifier may be connected to the cathode wiring layer of the transimpedance amplifier through a capacitor.

The optical receiver according to one aspect may further include a back surface ground provided on a back surface of the transimpedance amplifier and connected to a reference potential. The ground layer of the transimpedance amplifier may be provided on a back surface side of the cathode wiring layer and may be connected to the back surface ground through a TSV (Through Silicon Via) 22m or a DSV (Deep Silicon Via) 22p.

The light-receiving element may include a cathode relay pad connected between the cathode electrode and the first cathode pad through a cathode wiring pattern. The transimpedance amplifier may include a relay pad connected to the surface of the insulating layer through the cathode wiring layer and the second via and arranged to be spaced apart from each of the second pad and the third pad at a position corresponding to the cathode relay pad of the light-receiving element. The relay pad of the transimpedance amplifier may be connected to the cathode relay pad of the light-receiving element through a first columnar member.

A back surface metal layer may be provided on the back surface of the light-receiving element.

The cathode wiring layer may surround the first pad, and the cathode electrode and the cathode wiring may be arranged on both sides of the anode electrode and the anode wiring. In this case, since the cathode electrode and the cathode wiring surround the anode electrode and the anode wiring from both sides, magnetic fields generated by a current flowing through the light-receiving element cancel each other. For this reason, the magnetic field is less likely to leak to the outside of the cathode wiring, and crosstalk due to electromagnetic coupling to other lanes can be alleviated.

DETAILS OF EMBODIMENTS OF THE PRESENT DISCLOSURE

Specific examples of the optical receiver according to the embodiment will be described below with reference to the drawings. The present disclosure is not limited to the following examples, but is intended to include all modifications disclosed in the claims and within the scope of equivalents to the claims. In the description of the drawings, the same or corresponding elements are denoted by the same reference numerals, and duplicate descriptions are omitted as appropriate. The drawings may be partially simplified or exaggerated in order to facilitate understanding, and the dimensional ratios and the like are not limited to those described in the drawings.

First Embodiment

Figure 2:
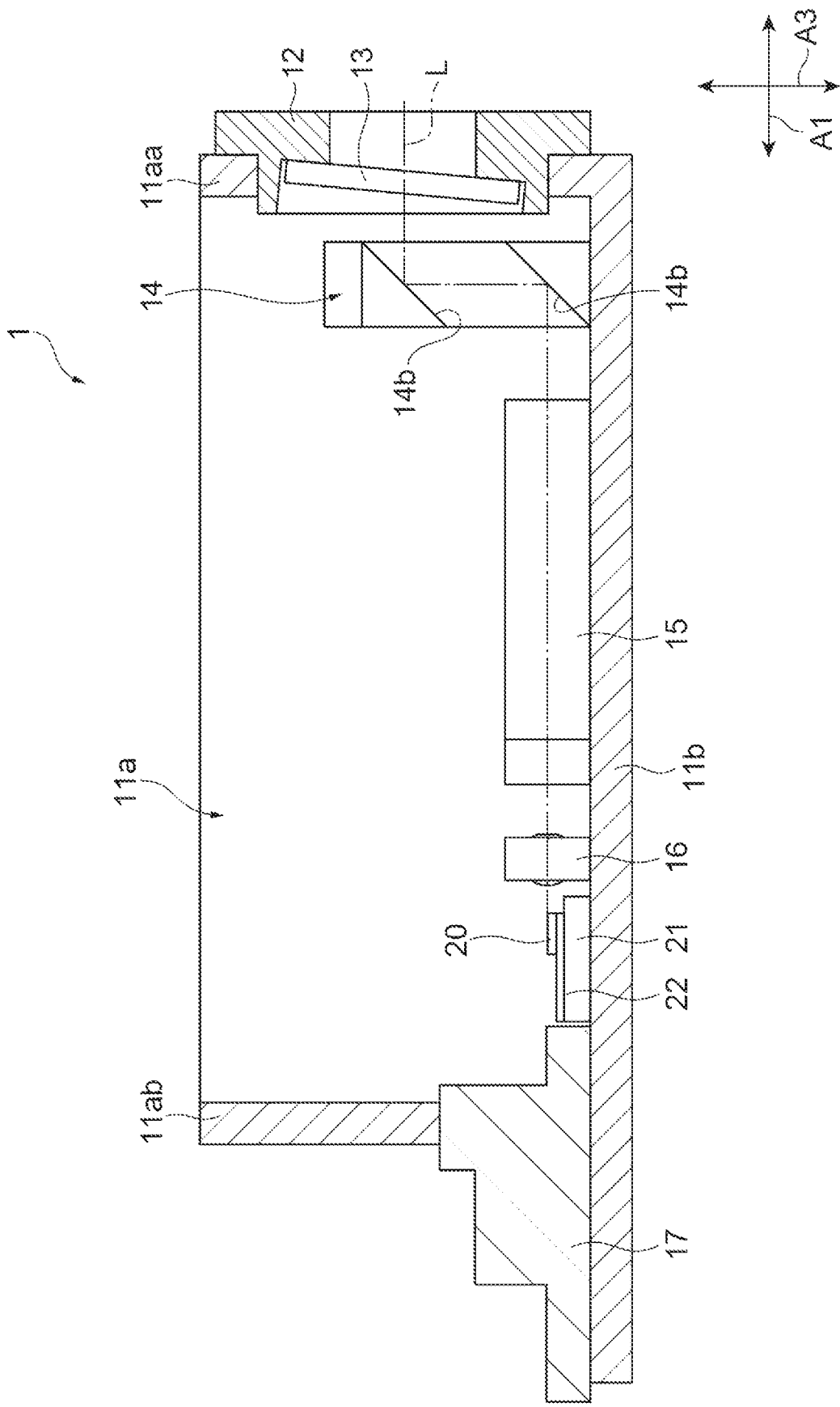
FIG. 2 is a schematic longitudinal cross-sectional view of the optical receiver.

A schematic configuration of an example of an optical receiver 1 will be described with reference to FIG. 1. The configuration of the optical receiver according to the present disclosure is not limited to the configuration of the optical receiver 1 described later. FIG. 1 is a plan view of an internal structure of the optical receiver 1 with a lid of a package detached. FIG. 2 is a schematic longitudinal cross-sectional view of the optical receiver 1. For example, the optical receiver 1 is used as a ROSA (Receiver Optical Sub Assembly) of an optical transceiver. The optical receiver 1 has a package 11. The package 11 has a sidewall 11a made of a metal and a bottom plate 11b made of a metal. The bottom plate 11b extends along a plane defined by a first direction A1 and a second direction A2 intersecting the first direction A1. The sidewall 11a includes a sidewall 11aa and a sidewall 11ab extending along a plane intersecting the first direction A1. The sidewall 11aa and the sidewall 11ab are aligned along the first direction A1. An opening of the sidewall 11a on the side opposite to the bottom plate 11b is closed by the lid (not illustrated). The opening is formed in the sidewall 11aa. A bush 12 is provided in the opening of the sidewall 11aa. A receptacle of the optical receiver 1 is fixed through the bush 12. For example, an optical window 13 is arranged inside the bush 12.

The optical receiver 1 further includes an optical axis converter 14 converting an optical axis of an input light L, an optical demultiplexer 15 demultiplexing the light L, and a plurality of lenses 16 on which each light demultiplexed by the optical demultiplexer 15 is incident. The optical axis converter 14 has, for example, a pair of mirrors 14b. The light L is incident on one of the pair of mirrors 14b along the first direction A1. The light L incident on one mirror 14b has the optical axis bent by 90 degree, is reflected in the third direction A3, and is incident on the other mirror 14b. The light L incident on the other mirror 14b is reflected in the first direction A1 with the optical axis bent by 90 degree and is incident on the optical demultiplexer 15. The light L is, for example, a multiplexed signal light having a plurality of signal light components. The optical demultiplexer 15 demultiplexes the light L, which is the multiplexed signal light, into the plurality of signal light components. The light demultiplexed by the optical demultiplexer 15 is incident on each of the plurality of lenses 16.

The optical receiver 1 further has a feedthrough 17, a plurality of light-receiving elements 20 and a TIA (transimpedance amplifier) 22. The feedthroughs 17 are arranged on the sidewalls 11ab to perform electrical connection to an external circuit. A plurality of terminals 17a for electrical connection with the external circuit are provided in a portion of the feedthrough 17 located outside the sidewall 11ab. A plurality of terminals for electrical connection with the TIA 22 are provided in a portion of the feedthrough 17 located inside the sidewall 11ab. A plurality of terminals inside the sidewalls 11ab and a plurality of terminals 17a outside the sidewalls 11ab are short-circuited with each other by wirings embedded inside the feedthroughs 17.

Figure 3:
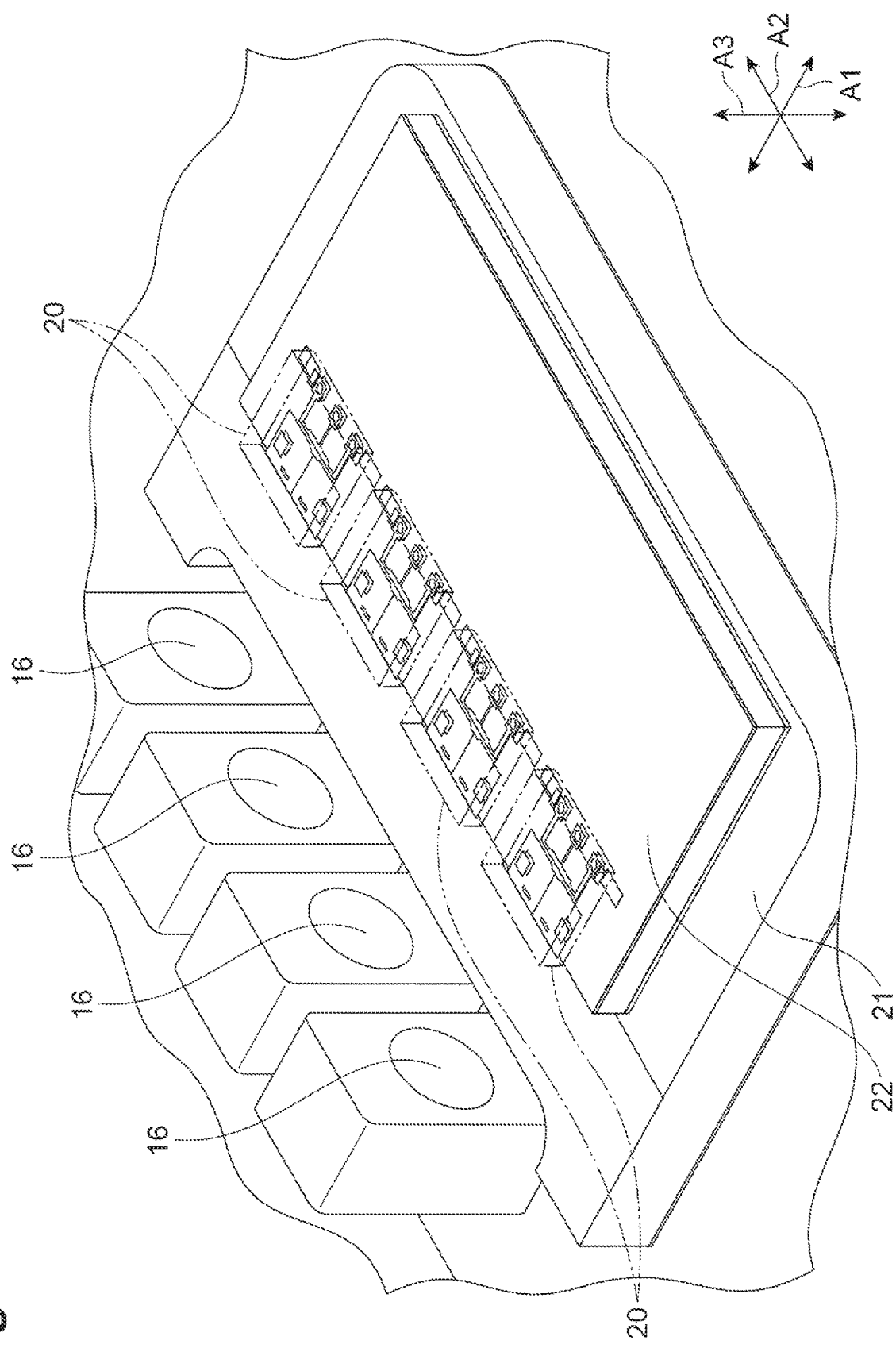
FIG. 3 is an enlarged perspective view of the periphery of a light-receiving element and a transimpedance amplifier of the optical receiver.

FIG. 3 is an enlarged perspective view of the plurality of lenses 16, the plurality of light-receiving elements 20, and the TIA 22 of the optical receiver 1. The plurality of lenses 16 are arranged between the optical demultiplexer 15 and the plurality of light-receiving elements 20. The plurality of lenses 16 are aligned along the second direction A2. Each of the plurality of lenses 16 collects each of the plurality of signal light components output from the optical demultiplexer 15 and guides each of the plurality of signal light components to each of the plurality of light-receiving elements 20. The optical receiver 1, for example, further includes a substrate 21 on which a TIA 22 and a capacitor 24 are mounted. The substrate 21 is arranged on the bottom plate 11b of the package 11.

The plurality of light-receiving elements 20 are mounted on the TIA 22. The plurality of light-receiving elements 20 are aligned on the TIA 22 along the second direction A2. As an example, the four light-receiving elements 20 are provided. However, the number of light-receiving elements 20 is not particularly limited. The light-receiving element 20 is a semiconductor element that converts the corresponding signal light component into an electrical signal. The light-receiving element 20 is optically coupled to the optical demultiplexer 15 through the lens 16. For example, the signal light component from the lens 16 is input to a side surface of the light-receiving element 20. The light-receiving element 20 is, for example, a waveguide type light-receiving element. The light-receiving element 20 is electrically connected to the TIA 22. The TIA 22 is arranged between the light-receiving element 20 and the feedthrough 17 and converts a current signal from the light-receiving element 20 into a voltage signal. The TIA 22 is electrically connected to the wiring of the feedthrough 17, for example, through the bonding wire (not illustrated). The voltage signal output from the TIA 22 is output to the outside of the optical receiver 1 through the feedthrough 17.

Figure 4:
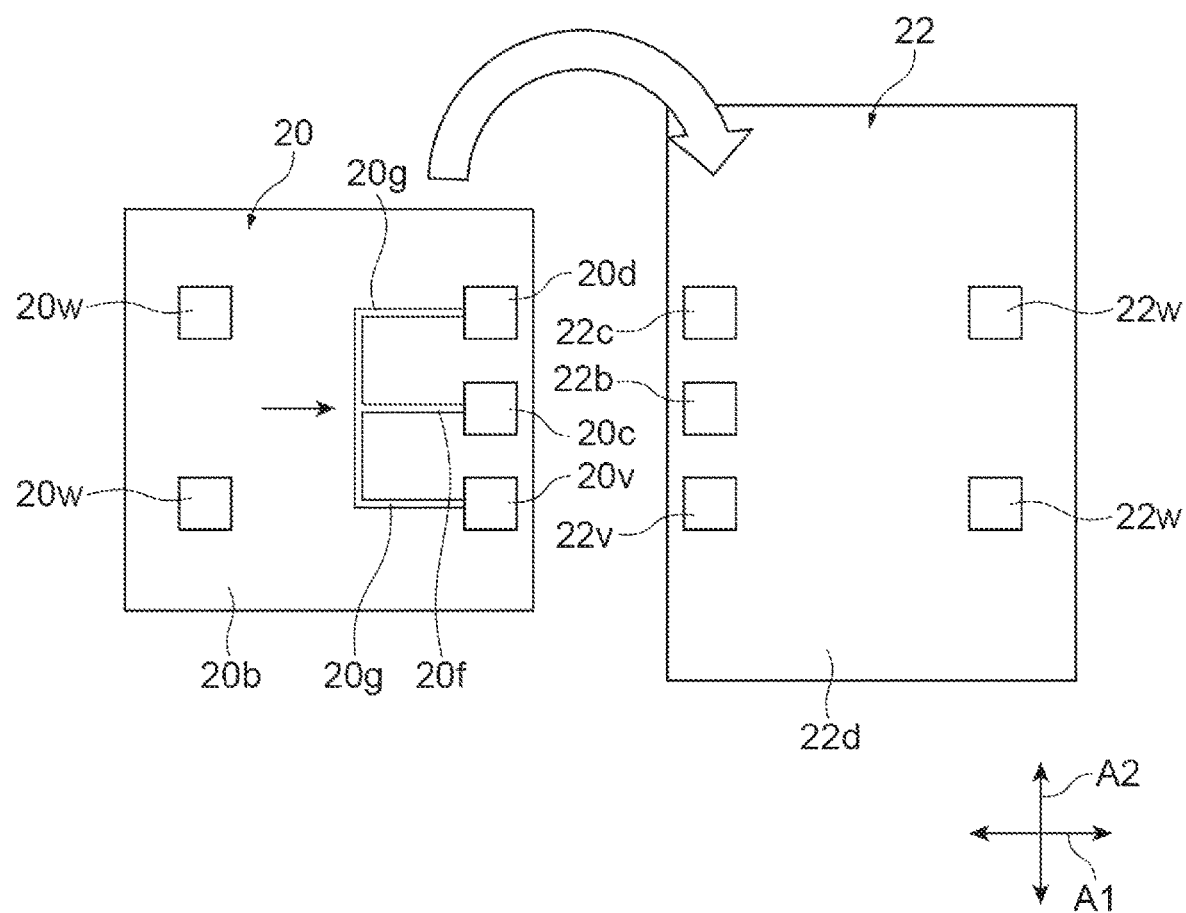
FIG. 4 is a schematic diagram of a light-receiving element and a transimpedance amplifier in an optical receiver according to a first embodiment.

As illustrated in FIG. 4, the light-receiving element 20 and the TIA 22 are flip-chip-bonded (FCB: Flip Chip Bonding). The light-receiving element 20 is mounted on a surface 22d of the TIA 22 in a flip manner. A face 20b of the light-receiving element 20 is the lower surface in FIG. 3 and is the face facing the surface 22d of the TIA 22. The face 20b of the light-receiving element 20 is provided with an anode pad 20c, a first cathode pad 20d, and a second cathode pad 20v. In the face 20b of the light-receiving element 20, the first cathode pad 20d and the second cathode pad 20v are arranged respectively on both sides of the anode pad 20c. The light-receiving element 20 is mounted so that the face 20b of the light-receiving element 20 and the surface 22d of the TIA 22 face each other as indicated by arrows in the figure.

For example, the first cathode pad 20d and the second cathode pad 20v are aligned along the second direction A2. The anode pad 20c is arranged between the first cathode pad 20d and the second cathode pad 20v arranged along the second direction A2. As a specific example, a surface metal of the face 20b, which is a flip chip connection surface of the light-receiving element 20, is provided with one anode pad 20c and at least three or more cathode pads including a first cathode pad 20d and a second cathode pad 20v. The anode pad 20c is connected to the anode electrode of the light-receiving element 20 through an anode wiring pattern 20f. Each of the first cathode pad 20d and the second cathode pad 20v is connected to the cathode electrode of the light-receiving element 20 through a cathode wiring pattern 20g. FIG. 4 illustrates an example where the light-receiving element 20 has one anode pad 20c, a first cathode pad 20d, a second cathode pad 20v, and two cathode pads 20w.

Figure 5:
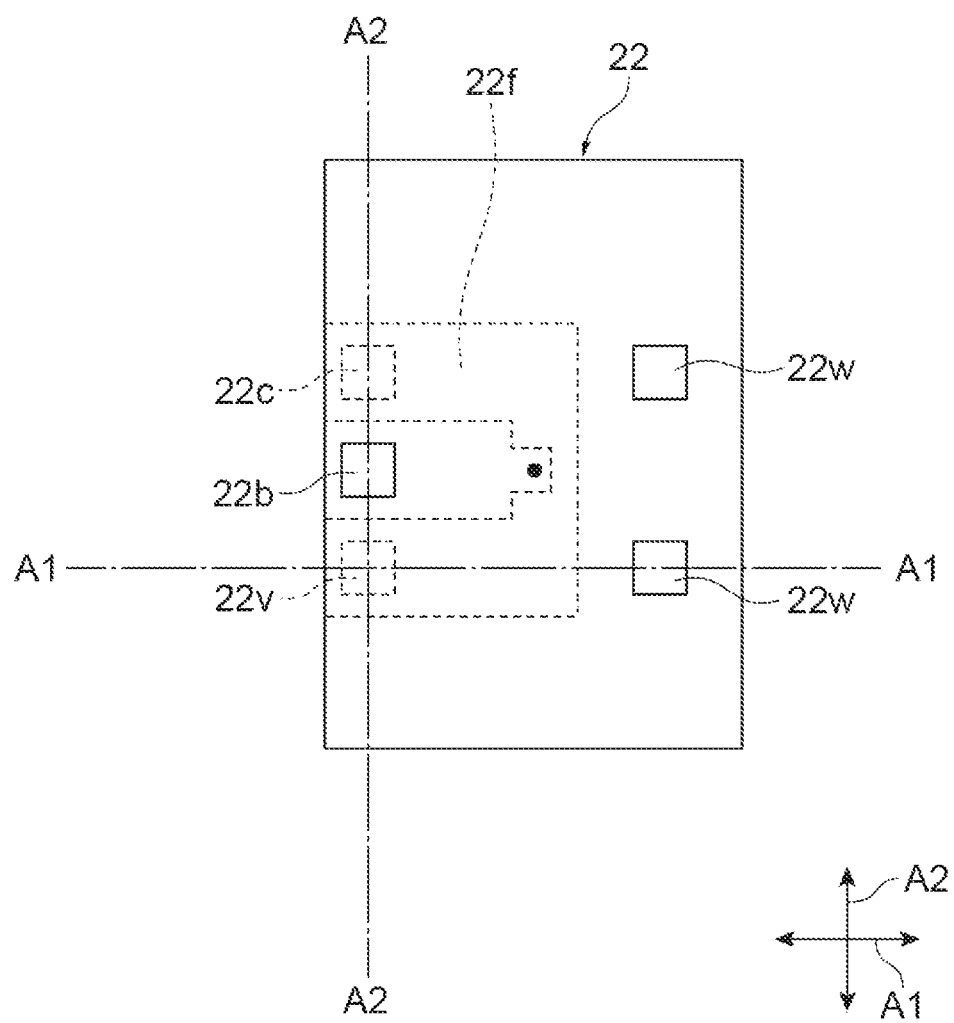
FIG. 5 is a diagram schematically illustrating the transimpedance amplifier of FIG. 4.

FIG. 5 is a diagram illustrating the layout of the TIA 22 on which the light-receiving element 20 is mounted. As illustrated in FIGS. 4 and 5, the TIA 22 has a first pad 22b, a second pad 22c, and a third pad 22v. For example, the second pad 22c and the third pad 22v are aligned along the second direction A2. The first pad 22b is arranged between the second pad 22c and the third pad 22v aligned along the second direction A2. The second pad 22c and the third pad 22v of the TIA 22 are arranged respectively on both sides of the first pad 22b. For example, the TIA 22 has only pads formed of a surface metal. The TIA 22 has no metal other than pads on the surface 22d facing the light-receiving element 20. FIG. 5 illustrates an example where the TIA 22 has a first pad 22b, a second pad 22c, a third pad 22v, and two pads 22w. The cathode wiring layer 22f is provided inside the TIA 22 described in detail later.

Figure 6:
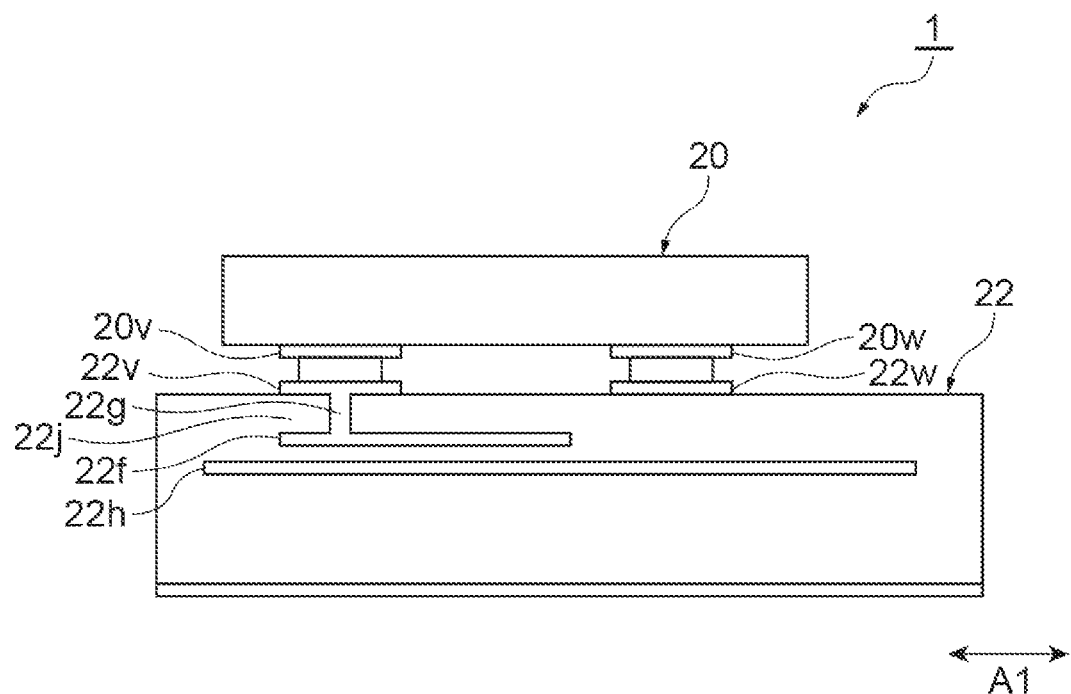
FIG. 6 is a schematic cross-sectional view of the transimpedance amplifier and the light-receiving element.
Figure 7:
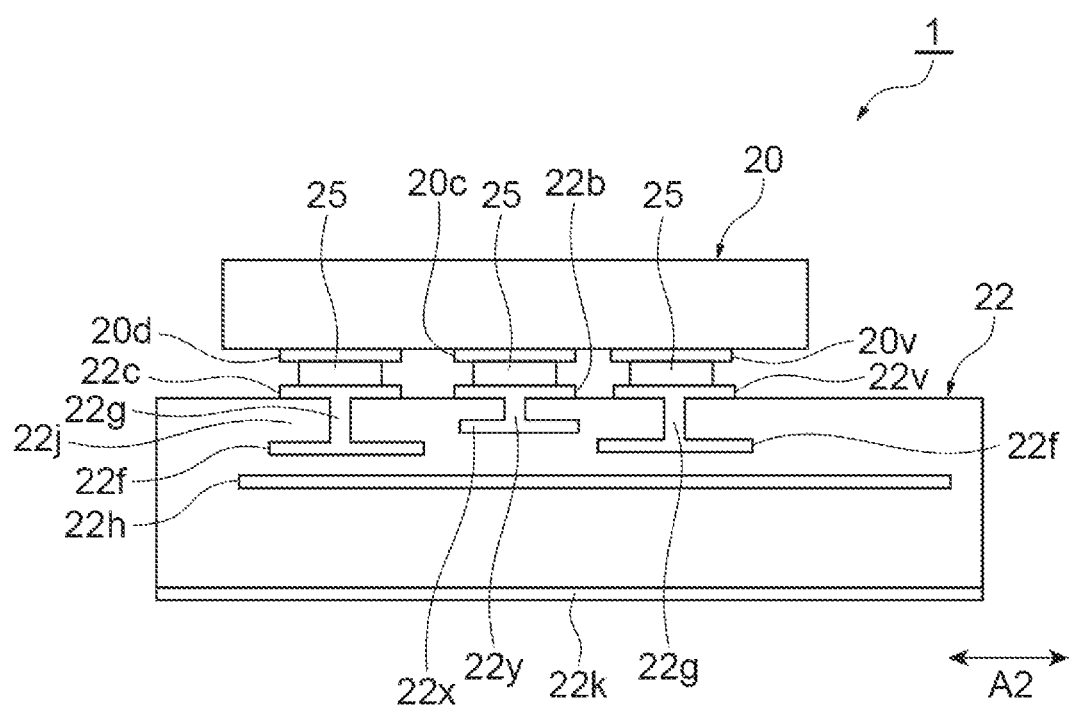
FIG. 7 is a schematic cross-sectional view of the transimpedance amplifier and the light-receiving element.

FIG. 6 illustrates a cross section of the light-receiving element 20 and the TIA 22 along the first direction A1 (line A1-A1) in FIG. 5. FIG. 7 illustrates a cross section of the light-receiving element 20 and the TIA 22 along the second direction A2 (line A2-A2) in FIG. 5. As illustrated in FIGS. 6 and 7, the first pad 22b of the TIA 22 is connected to the anode pad 20c of the light-receiving element 20. Each of the second pad 22c and the third pad 22v of the TIA 22 are connected to the first cathode pad 20d and the second cathode pad 20v of the light-receiving element 20, respectively.

The first pad 22b of the TIA 22 is connected to an anode wiring layer 22x inside the TIA 22 through a via 22y. The anode wiring layer 22x supplies an anode potential. Each of the second pad 22c and the third pad 22v of the TIA 22 are connected to the cathode wiring layer 22f of the TIA 22 through a via 22g (first via). The cathode wiring layer 22f supplies a cathode potential. The anode wiring layer 22x and the cathode wiring layer 22f are provided in an insulating layer 22j. The first pad 22b, the second pad 22c, and the third pad 22v are provided on the insulating layer 22j. The cathode wiring layer 22f of the TIA 22 is connected to a ground layer 22h of the TIA 22 through a capacitor.

Second Embodiment

An optical receiver according to a second embodiment will be described. A portion of the configuration of the optical receiver according to the second embodiment overlaps with a portion of the configuration of the optical receiver 1 according to the first embodiment. Therefore, in the following description, the same contents as those described above including the configuration of the optical receiver 1 are denoted by the same reference numerals, and the description thereof will be omitted as appropriate.

Figure 8:
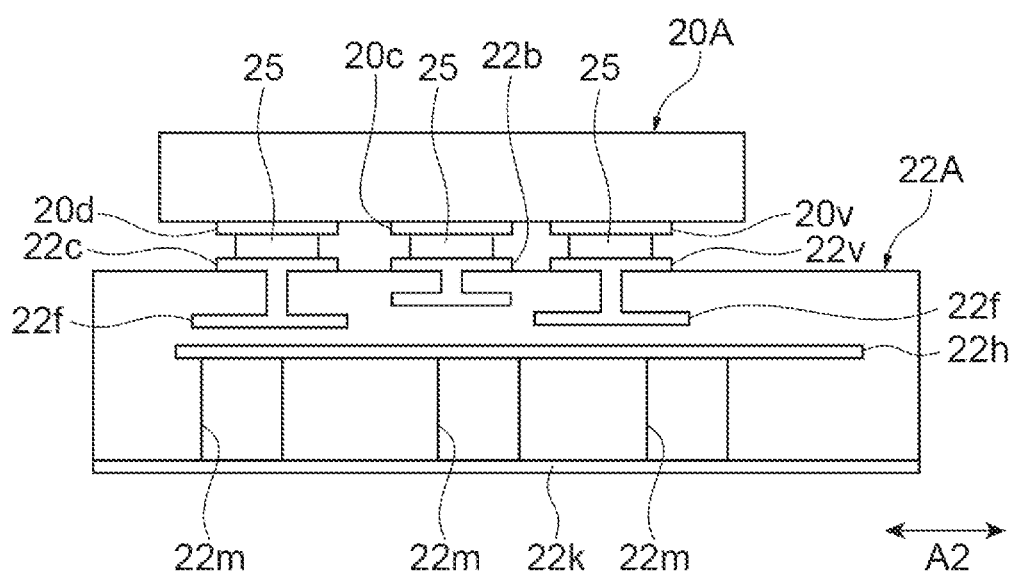
FIG. 8 is a schematic cross-sectional view of a transimpedance amplifier and a light-receiving element according to a second embodiment.

FIG. 8 illustrates a side surface of a light-receiving element 20A and a TIA 22A according to the second embodiment as seen along the first direction A1. As illustrated in FIG. 8, the ground layer 22h of the TIA 22A is connected to a back surface ground 22k of the TIA 22A through a TSV (Through Silicon Via). The TSV indicates a configuration in which the back surface ground 22k of the TIA 22A is connected to the ground layer 22h through a via 22m. The cathode wiring layer 22f is connected to the ground layer 22h through a capacitor. The light-receiving element 20A and the TIA 22A are connected through a pillar 25 (columnar member). The height of the pillar 25 is, for example, 20 μm or less. The light-receiving element 20A and the TIA 22A may be connected through bumps.

Third Embodiment

Figure 9:
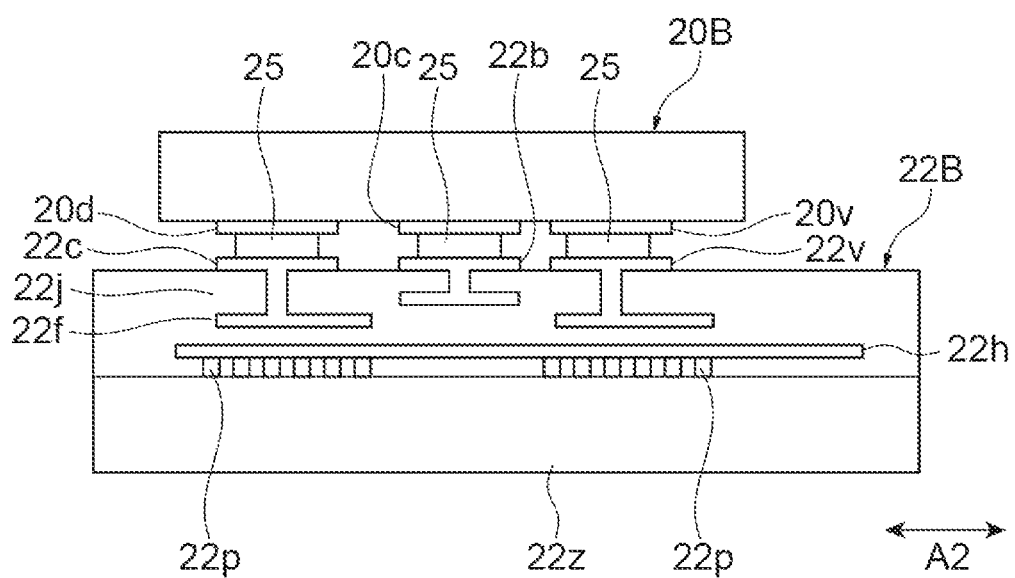
FIG. 9 is a schematic cross-sectional view of a transimpedance amplifier and a light-receiving element according to a third embodiment.

FIG. 9 illustrates a side surface of a light-receiving element 20B and a TIA 22B according to a third embodiment as seen along the first direction A1. As illustrated in FIG. 9, the ground layer 22h of the TIA 22B is connected to a heavily doped substrate 22z of the TIA 22B through a DSV (Deep Silicon Via). The DSV is connected through the via 22p from the heavily doped substrate 22z of the TIA 22B to an insulating layer 22j.

Figure 10:
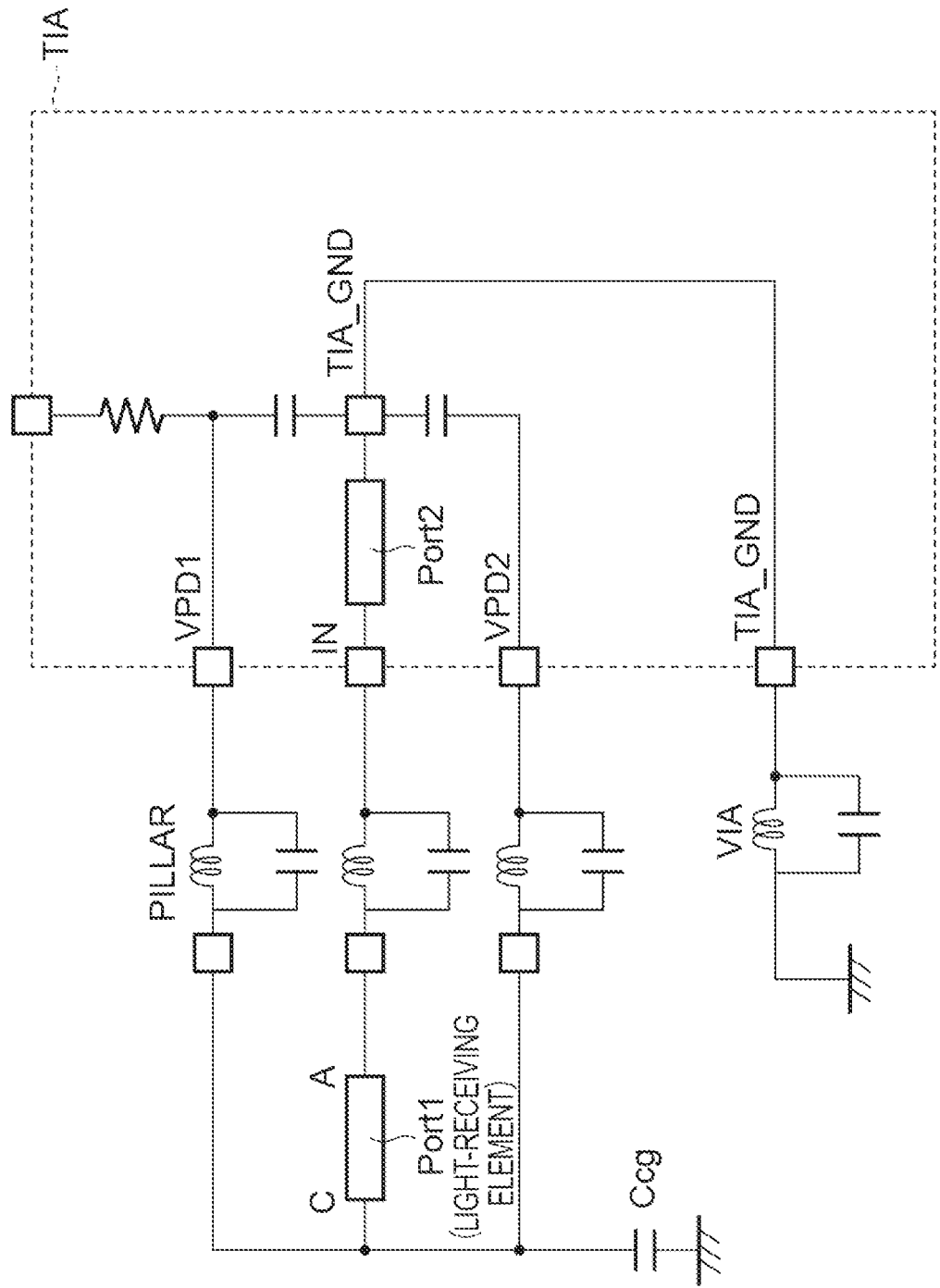
FIG. 10 is a diagram illustrating an equivalent circuit of a transimpedance amplifier and a light-receiving element.

FIG. 10 illustrates an RF current path electrical equivalent circuit between the light-receiving element and the TIA. FIG. 10 illustrates an equivalent circuit when the light-receiving element and the TIA are flip-chip-bonded. A "port 1" in FIG. 10 indicates a site set between the anode (A) and the cathode (C) of the light-receiving element. A "port 2" indicates a site set between the TIA input (IN) TIA_GND. The RF current of the light-receiving element 20, for example, passes through the input of the TIA from the anode of the light-receiving element, reaches the TIA_GND, and is then capacitively coupled to a VPDx (x is a natural number) which is the cathode bias supply terminal of the TIA. Then, the RF current flows from the VPDx through the pillar to return to the cathode (C) of the light-receiving element.

Since the pillar is formed between the light-receiving element and the pad of the TIA as described above, when a pad larger than the pillar is formed on the TIA, parasitic capacitance is generated between the light-receiving element and the TIA, and a parallel resonant circuit is formed with the inductance and the capacitance of the pillar. When this inductance is several tens of pH and the capacitance is several tens of fF, the RF current path will be cut off in order to cause the resonance near 80 GHz. As for the TIA, when the inductance of the VIA is large, since the cathode forms a series resonance circuit with an earth ground and a generated parasitic capacitance Ccg, at the resonance frequency determined by these numerical values, a shunting occurs in the RF path of the current of the original light-receiving element, and thus, a loss occurs. In the optical receivers according to the first to third embodiments described above, each of the problems described above can be solved, and the resonance frequency can be set to 100 GHz or higher.

Functions and effects obtained from the optical receivers according to the first to third embodiments will be described. As illustrated in FIG. 7, in the optical receiver 1, the TIA 22 includes a cathode wiring layer 22f, a first pad 22b, a second pad 22c, and a third pad 22v. A light-receiving element 20 includes an anode pad 20c, a first cathode pad 20d, and a second cathode pad 20v. The light-receiving element 20 is mounted on the TIA 22. In the TIA 22, each of the second pad 22c and the third pad 22v are arranged on both sides of the first pad 22b. In the light-receiving element 20, each of the first cathode pad 20d and the second cathode pad 20v are arranged on both sides of the anode pad 20c. The first pad 22b of the TIA 22 is connected to the anode pad 20c of the light-receiving element 20. The second pad 22c of the TIA 22 is connected to the first cathode pad 20d of the light-receiving element 20. The third pad 22v of the TIA 22 is connected to the second cathode pad 20v of the light-receiving element 20. With the above configuration, the resonance frequency caused by parasitic capacitance or inductance can be shifted to the high frequency side. For example, the frequency of the resonant circuit existing in the RF current path between the light-receiving element 20 and the TIA 22 can be 100 GHz or higher.

The first pad 22b of the TIA 22 may be connected to the anode pad 20c of the light-receiving element 20 through the pillar 25 or the bump. The second pad 22c of the TIA 22 may be connected to the first cathode pad 20d of the light-receiving element 20 through the pillar 25 or the bump. The third pad 22v of the TIA 22 may be connected to the second cathode pad 20v of the light-receiving element 20 through the pillar 25 or the bump.

The TIA 22 may further include the ground layer 22h having a reference potential. The ground layer 22h of the TIA 22 may be connected to the cathode wiring layer 22f of the TIA 22 through a capacitor.

As illustrated in FIGS. 8 and 9, the optical receiver 1 may further include a back surface ground 22k provided on the back surface of the TIA 22A (TIA 22B) having a reference potential. The ground layer 22h of the TIA 22A may be provided on the back surface side of the cathode wiring layer 22f and may be connected to the back surface ground 22k through the TSV or the DSV.

A back surface metal layer may be provided on the back surface of the light-receiving element 20.

As illustrated in FIGS. 4 and 5, the cathode wiring layer 22f (cathode wiring) may surround the first pad 22b. The first cathode pad 20d (cathode electrode), the second cathode pad 20v (cathode electrode), and the cathode wiring pattern 20g (cathode wiring) may surround the anode pad 20c (anode electrode) and the anode wiring pattern 20f (anode wiring) from both sides. In this case, since the cathode electrode and the cathode wiring surround the anode electrode and the anode wiring from both sides, the magnetic fields generated by a current flowing through the light-receiving element 20 cancel each other. For this reason, the magnetic field is less likely to leak to the outside of the cathode wiring, and crosstalk due to electromagnetic coupling to other lanes can be alleviated.

Next, examples of the optical receiver according to the present disclosure will be described. It is noted that the present disclosure is not limited to the examples described later. An optical receiver 1C according to Example 1 and an optical receiver 1D according to Example 2 will be described with reference to FIGS. 11 and 12.

Figure 11:
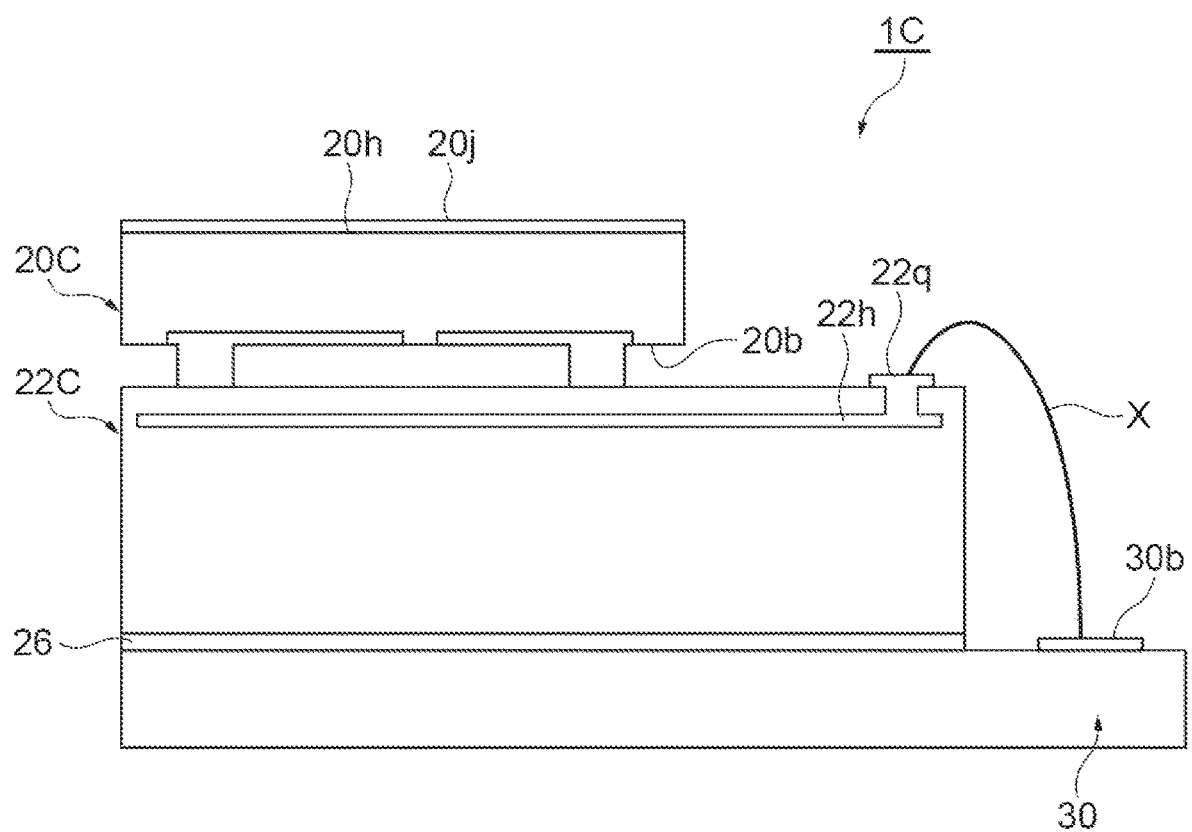
FIG. 11 is a schematic cross-sectional view of a transimpedance amplifier and a light-receiving element according to Example 1.

As illustrated in FIG. 11, the optical receiver 1C according to Example 1 includes a TIA 22C and a light-receiving element 20C mounted on a substrate 30. The substrate 30 is made of CuW (copper tungsten). The TIA 22C is made of Si (silicon). A conductive silver paste 26 is interposed between the substrate 30 and the TIA 22C. The substrate 30 is provided with pads 30b. The pad 30b and a pad 22q connected to the ground layer 22h of the TIA 22C are connected to each other by a bonding wire X. A back surface metal 20j is provided on a back surface 20h of the light-receiving element 20C opposite to the face 20b facing the TIA 22C.

Figure 12:
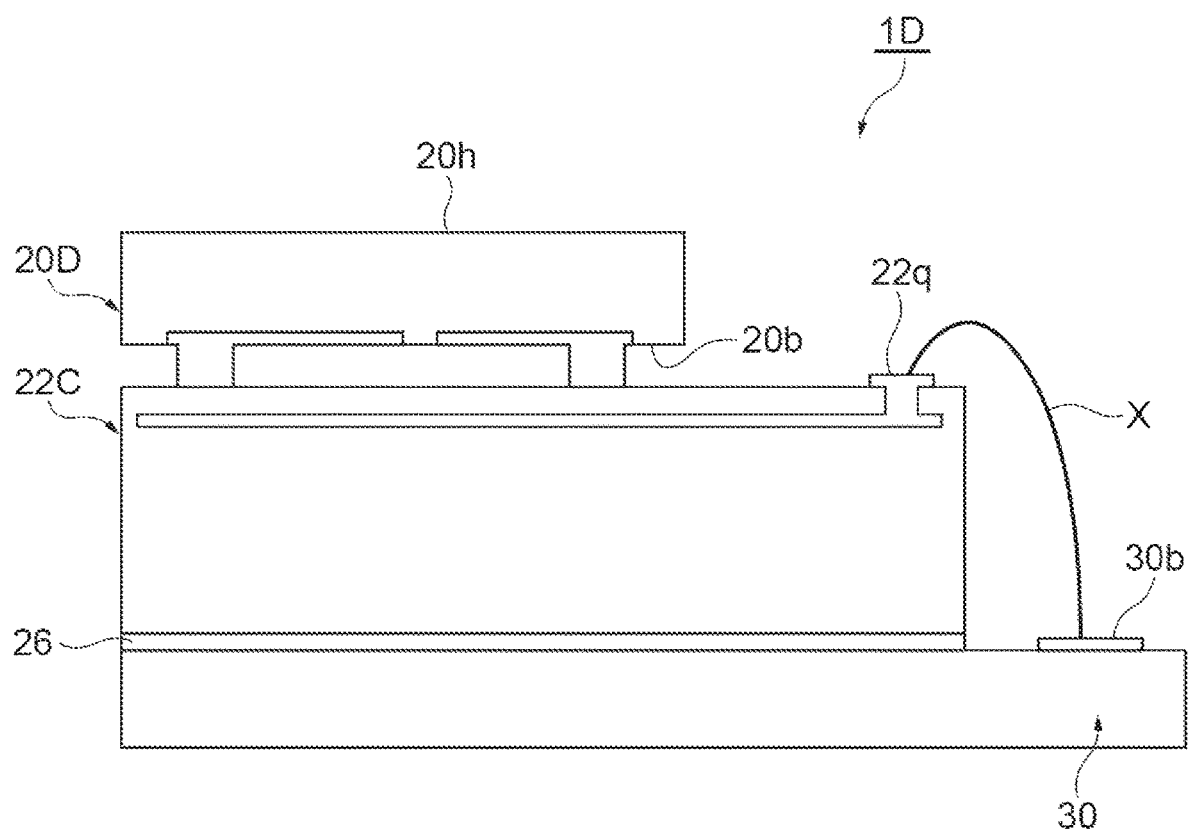
FIG. 12 is a schematic cross-sectional view of a transimpedance amplifier and a light-receiving element according to Example 2.

As illustrated in FIGS. 11 and 12, the optical receiver 1D according to Example 2 is different from the optical receiver 1C according to Example 1 in that a light-receiving element 20D having no back surface metal 20j is provided on the back surface 20h. Examples of resonance frequencies in the optical receiver 1C according to Example 1 described above and the optical receiver 1D according to Example 2 described above are illustrated in FIGS. 13 and 14.

Figure 13:
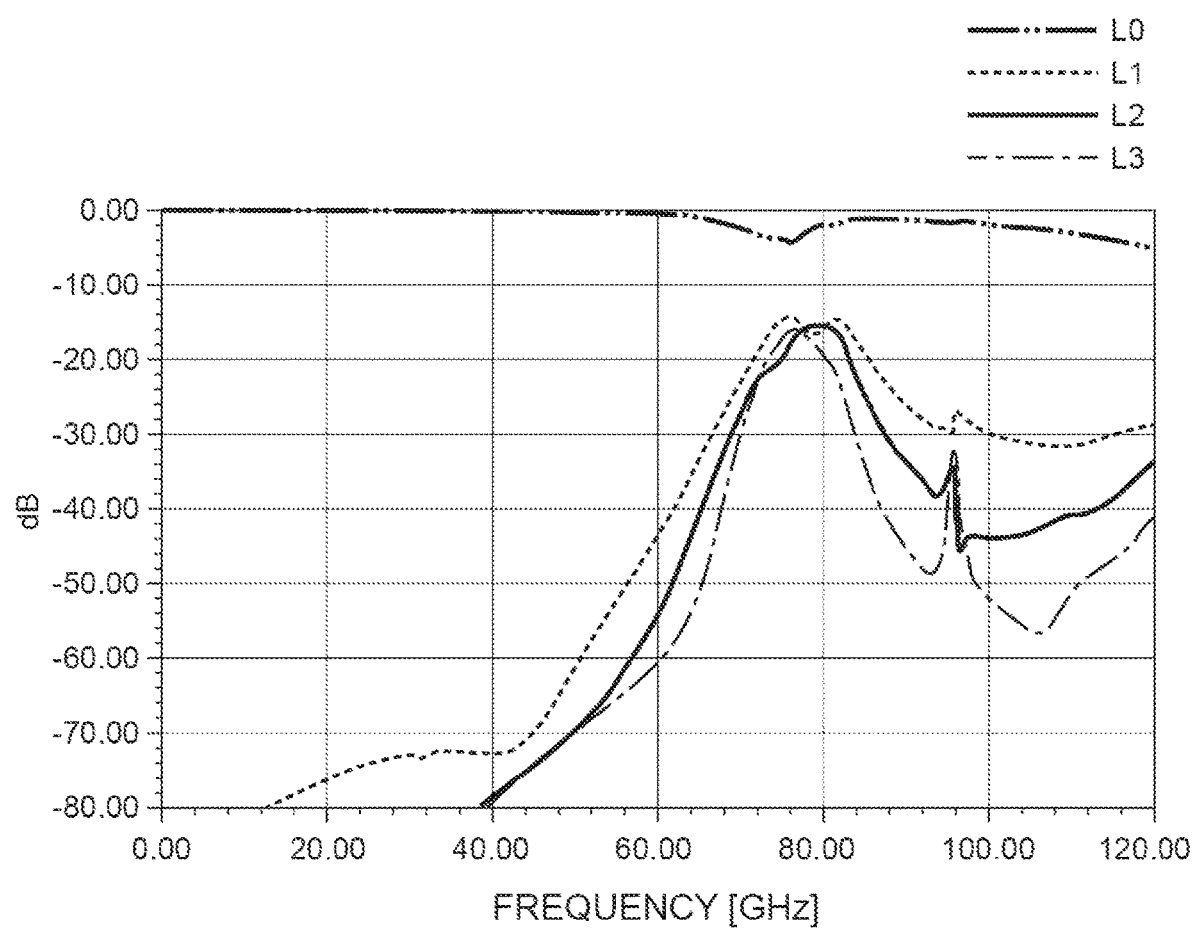
FIG. 13 is a graph illustrating resonance frequencies in the transimpedance amplifier and the light-receiving element of Example 1.
Figure 14:
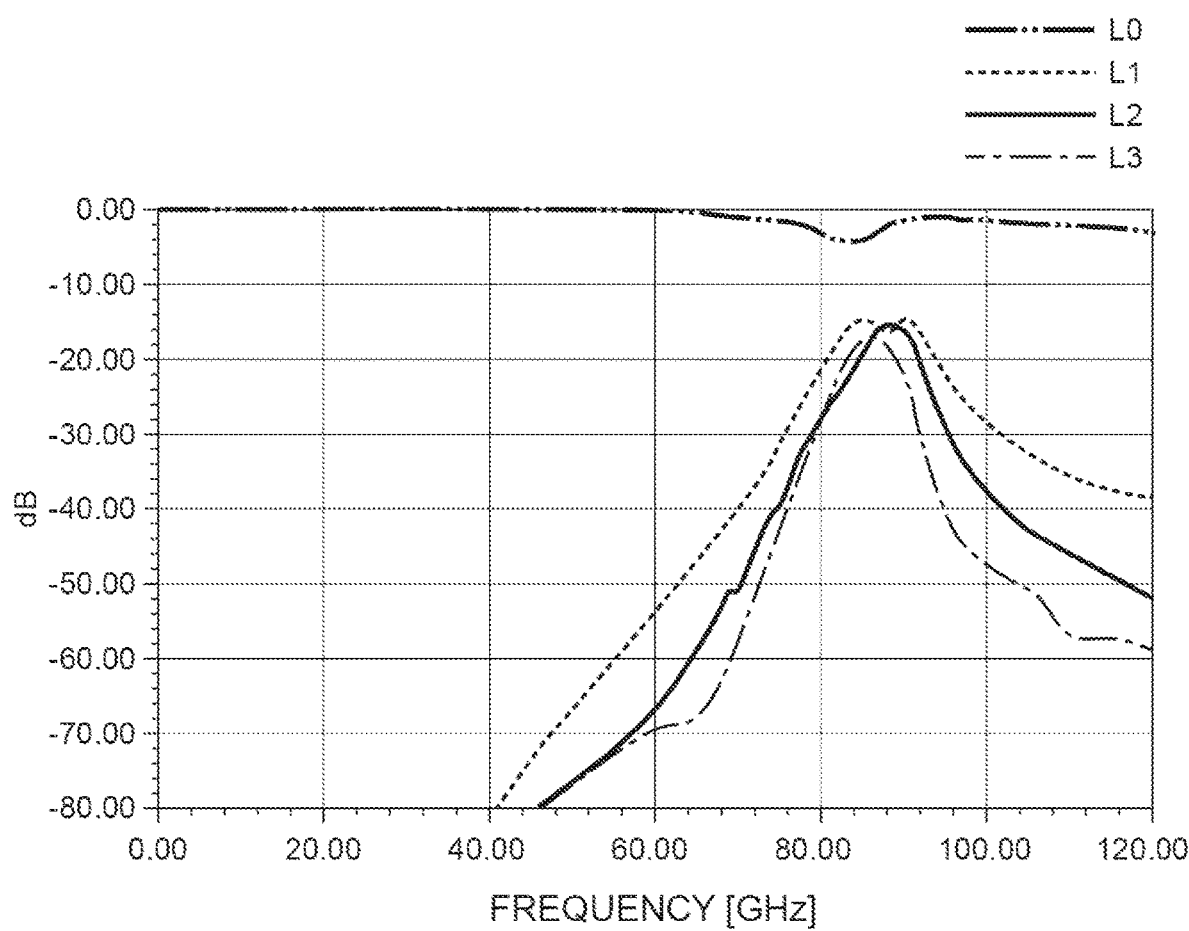
FIG. 14 is a graph illustrating resonance frequencies in the transimpedance amplifier and the light-receiving element of Example 2.

FIG. 13 is a graph illustrating the resonance frequency of the optical receiver 1C according to Example 1 for each channel of the light-receiving element. FIG. 14 is a graph illustrating the resonance frequency of the optical receiver 1D according to Example 2 for each channel of the light-receiving element. As illustrated in FIGS. 13 and 14, in the case of Example 2 that does not have the back surface metal 20j, the resonance frequency (resonance point) is slightly shifted to the high frequency side compared with Example 1 that has the back surface metal 20j (about 85 GHz).

Figure 15:
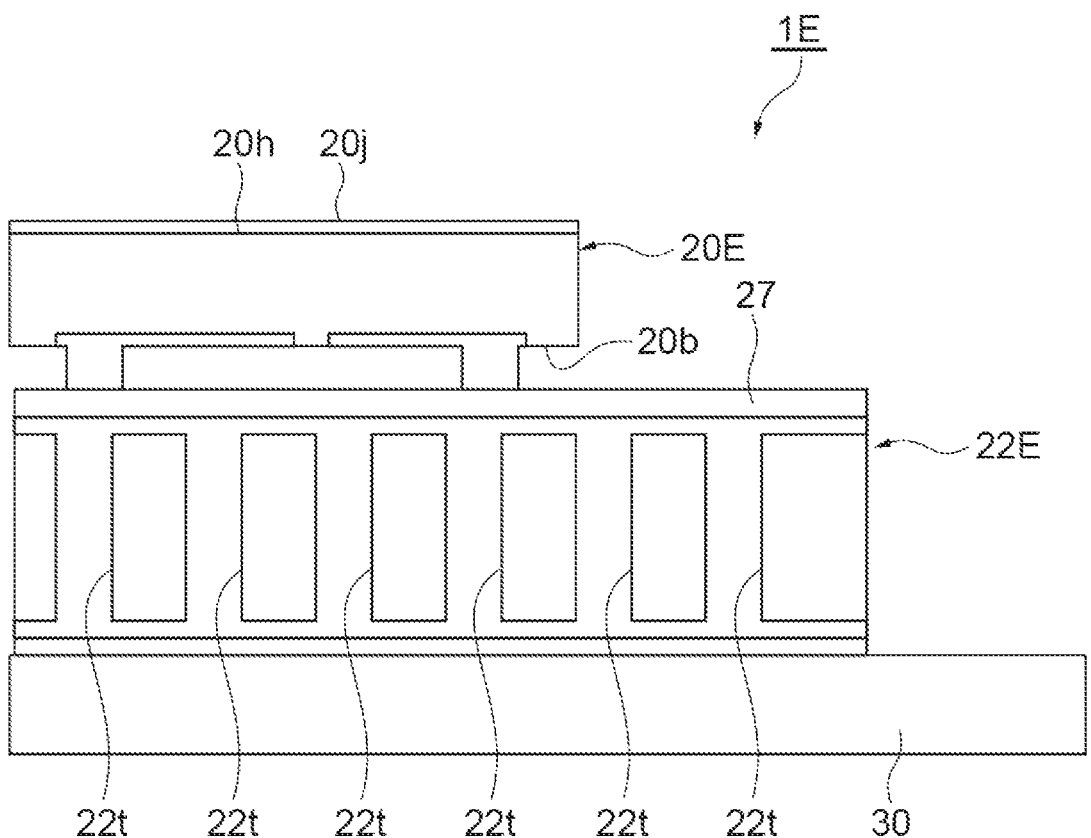
FIG. 15 is a schematic cross-sectional view of a transimpedance amplifier and a light-receiving element according to Example 3.
Figure 16:
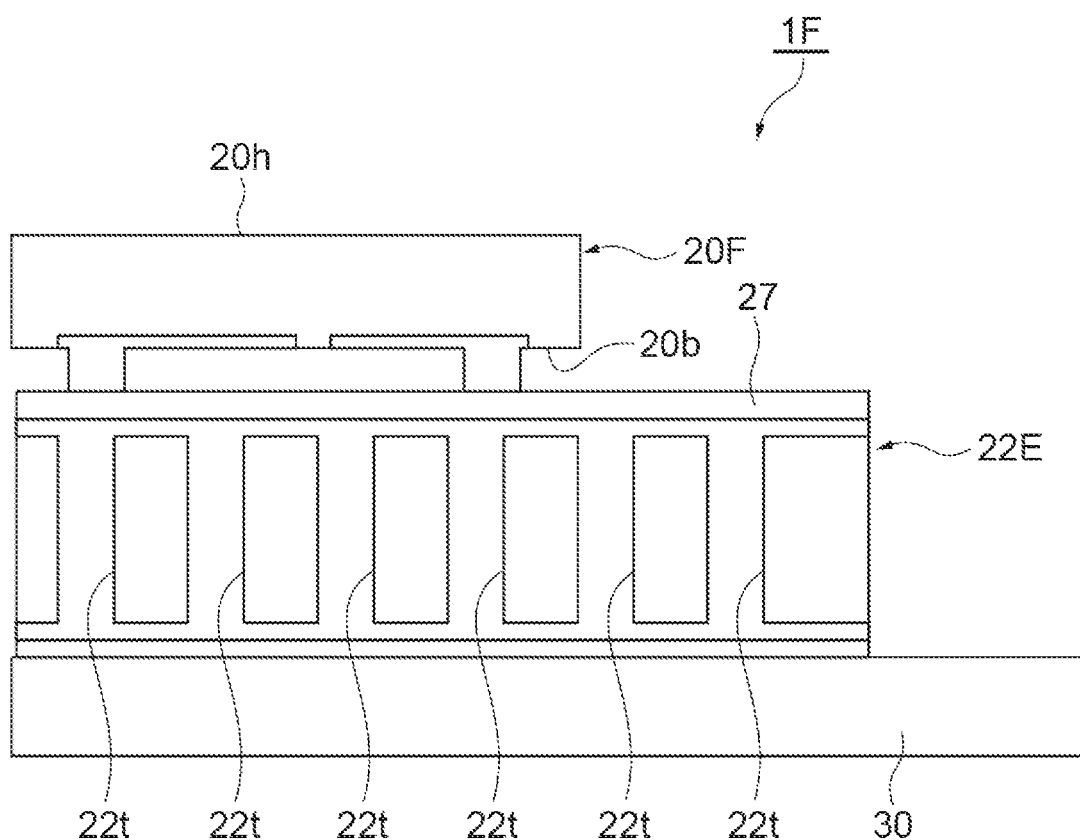
FIG. 16 is a schematic cross-sectional view of a transimpedance amplifier and a light-receiving element according to Example 4.

An optical receiver 1E according to Example 3 and an optical receiver 1F according to Example 4 will be described with reference to FIGS. 15 and 16. The optical receiver 1E according to Example 3 includes a TIA 22E and a light-receiving element 20E mounted on the substrate 30. A plurality of vias 22t extending along the stacking direction of the light-receiving elements 20E are formed in the TIA 22E. A silicon nitride 27 (SiN) is interposed between the light-receiving element 20E and the TIA 22E. The back surface metal 20j is provided on the back surface 20h opposite to the face 20b of the light-receiving element 20E facing the TIA 22E. The optical receiver 1F according to Example 4 is different from the optical receiver 1E according to Example 3 in that a light-receiving element 20F having no back surface metal 20j is provided on the back surface 20h.

Figure 17:
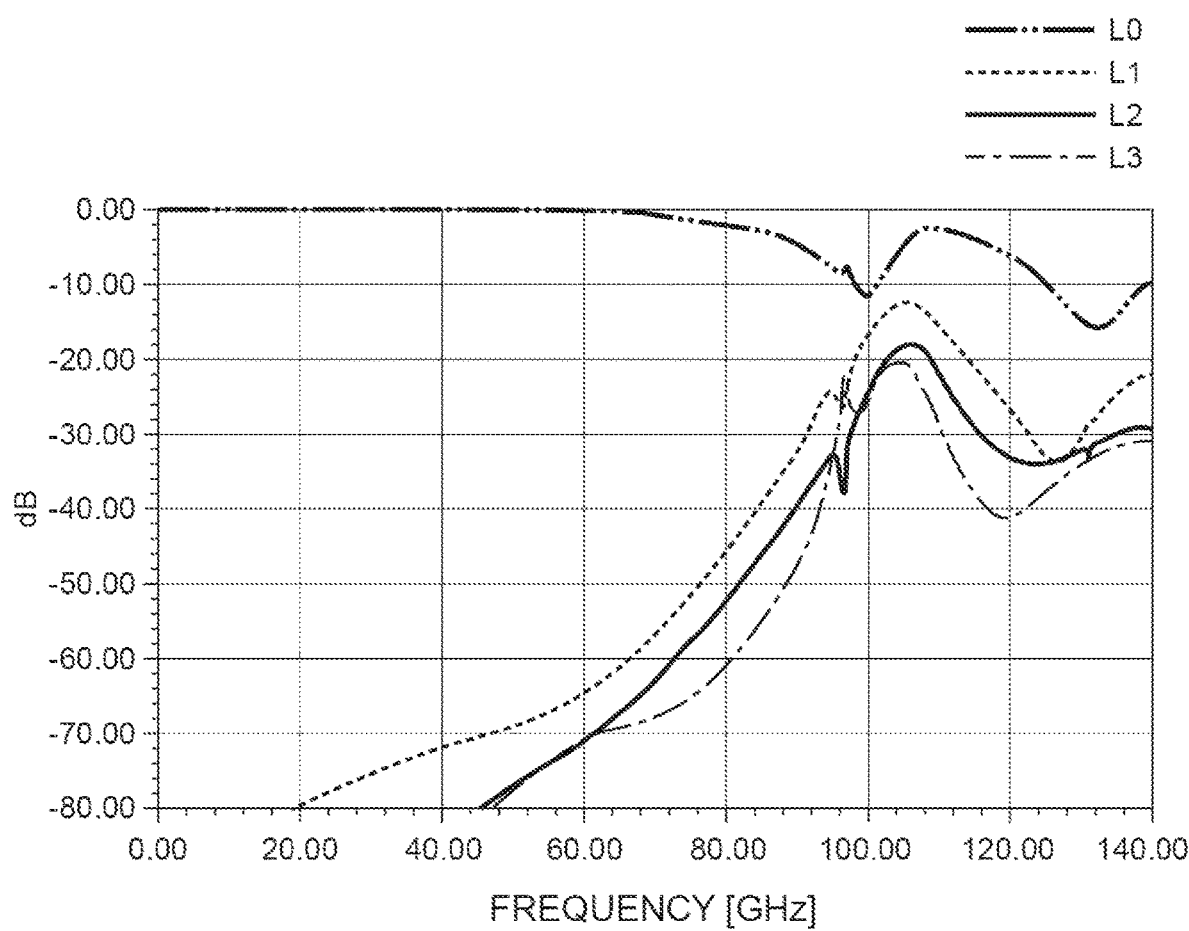
FIG. 17 is a graph illustrating resonance frequencies in the transimpedance amplifier and the light-receiving element of Example 3.
Figure 18:
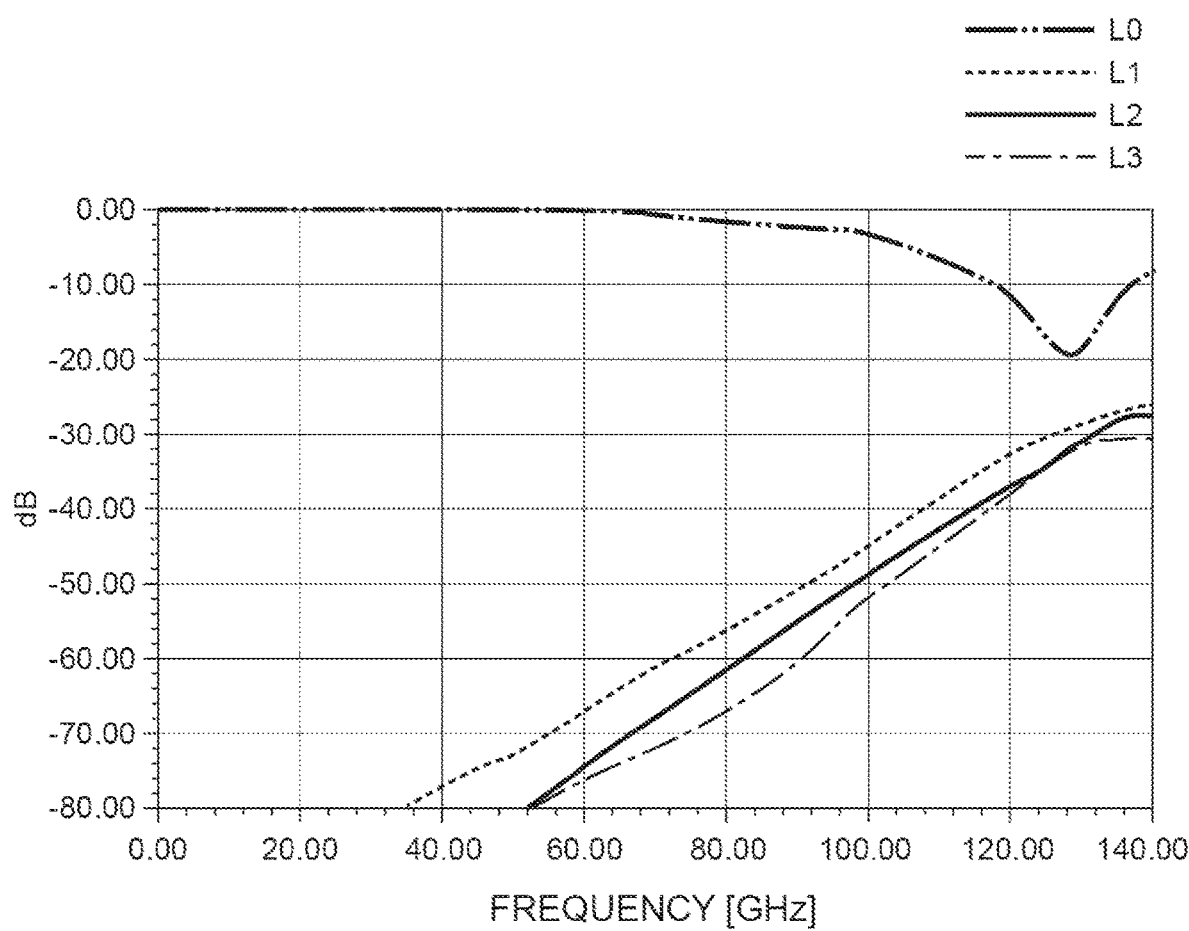
FIG. 18 is a graph illustrating resonance frequencies in the transimpedance amplifier and the light-receiving element of Example 4.

FIG. 17 is a graph illustrating the resonance frequency of the optical receiver 1E according to Example 3 for each channel of the light-receiving element. FIG. 18 is a graph illustrating the resonance frequency of the optical receiver 1F according to Example 4 for each channel of the light-receiving element. As illustrated in FIGS. 17 and 18, it is found that, in the case of Examples 3 and 4 in which a plurality of vias 22t extending along the stacking direction are formed, the resonance frequency can be increased to about 100 GHz. In the case of Example 4 having no back surface metal 20j, compared with Example 3 having the back surface metal 20j, it is found that the resonance frequency can be further shifted to a high frequency side (about 130 GHz).

Figure 19:
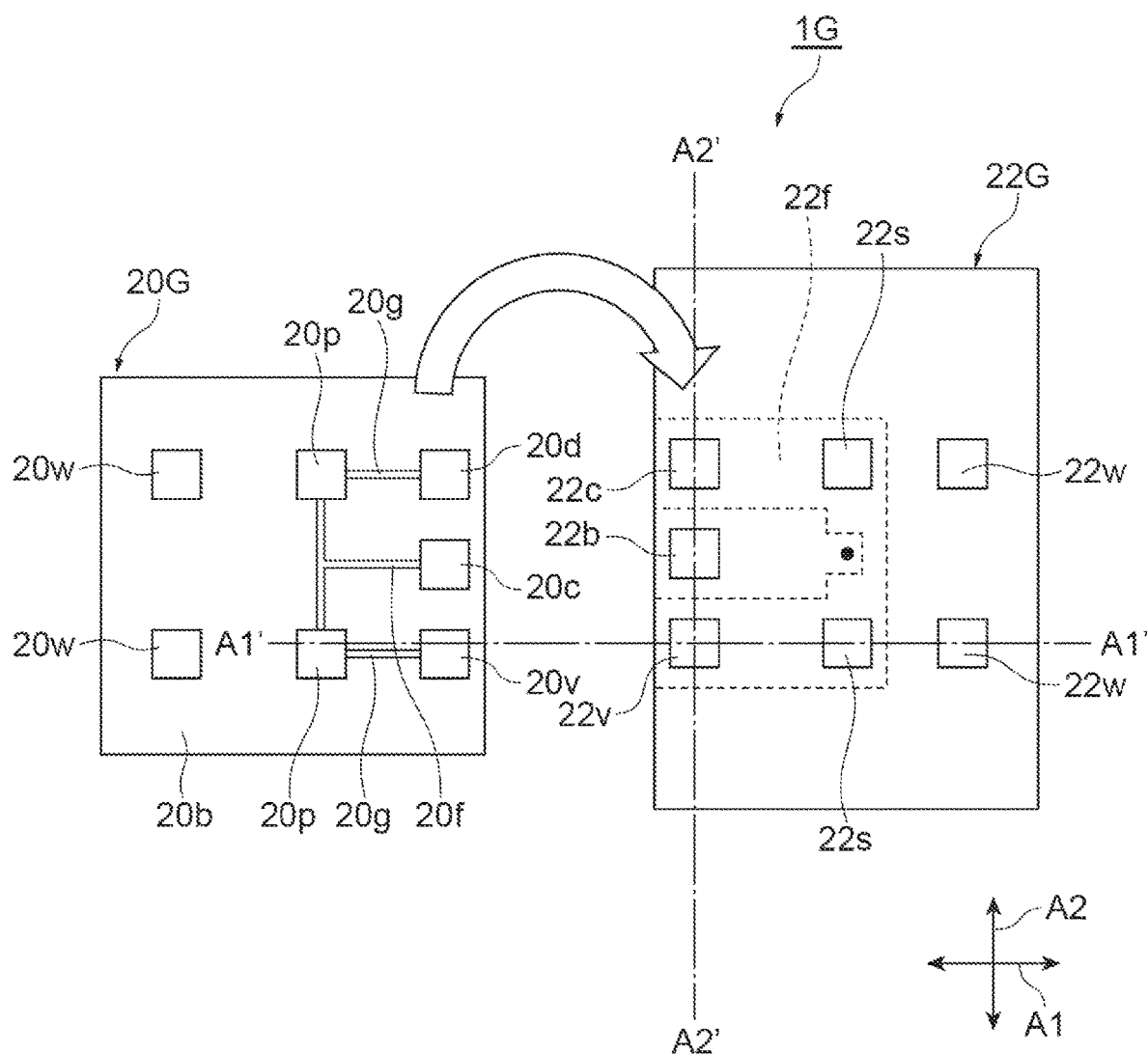
FIG. 19 is a schematic diagram of a transimpedance amplifier and a light-receiving element according to Example 5.

Next, an optical receiver 1G according to Example 5 will be described with reference to FIGS. 19 to 21. As illustrated in FIG. 19, the optical receiver 1G has a light-receiving element 20G and a TIA 22G. The light-receiving element 20G and TIA 22G are flip-chip-bonded. The light-receiving element 20G has an anode pad 20c provided on a face 20b facing the TIA 22G, a first cathode pad 20d, and a second cathode pad 20v.

The anode pad 20c is connected to the anode electrode of the light-receiving element 20 through the anode wiring pattern 20f. The light-receiving element 20G includes a cathode relay pad 20p connected between the cathode electrode of the light-receiving element 20G and the first cathode pad 20d through the cathode wiring pattern 20g. The TIA 22G has a cathode wiring layer 22f inside.

Figure 20:
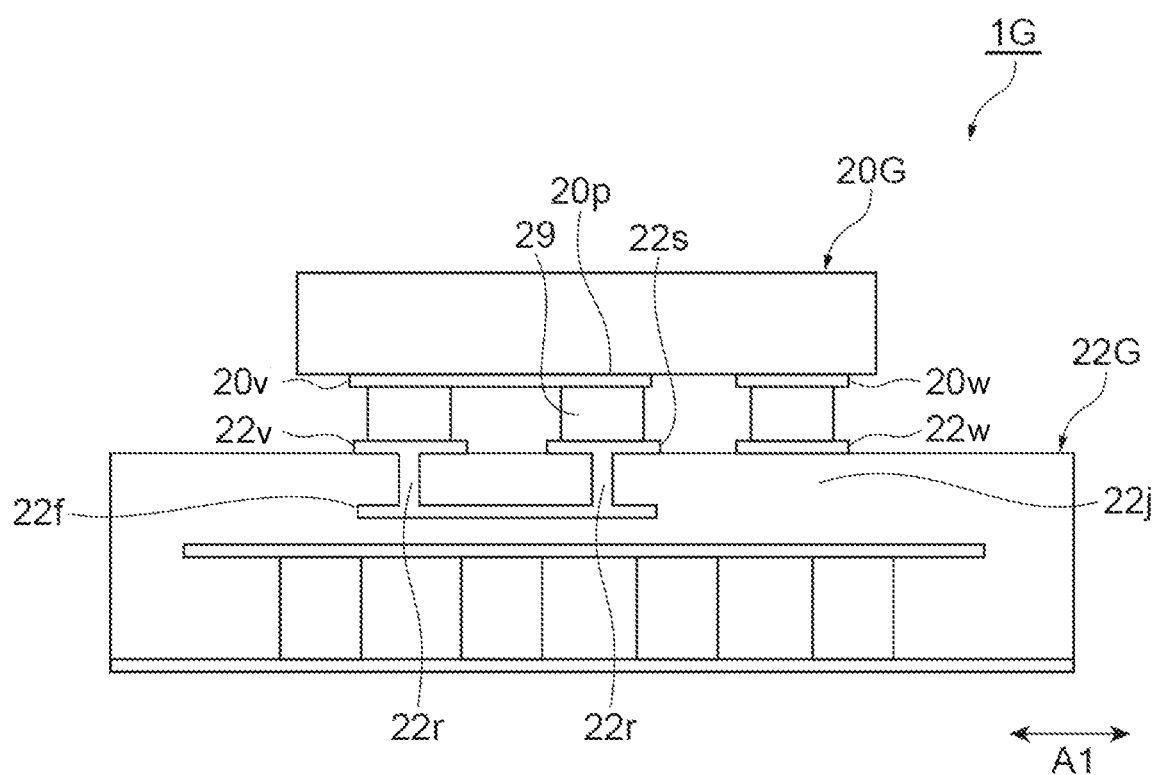
FIG. 20 is a schematic cross-sectional view of the transimpedance amplifier and the light-receiving element according to Example 5.
Figure 21:
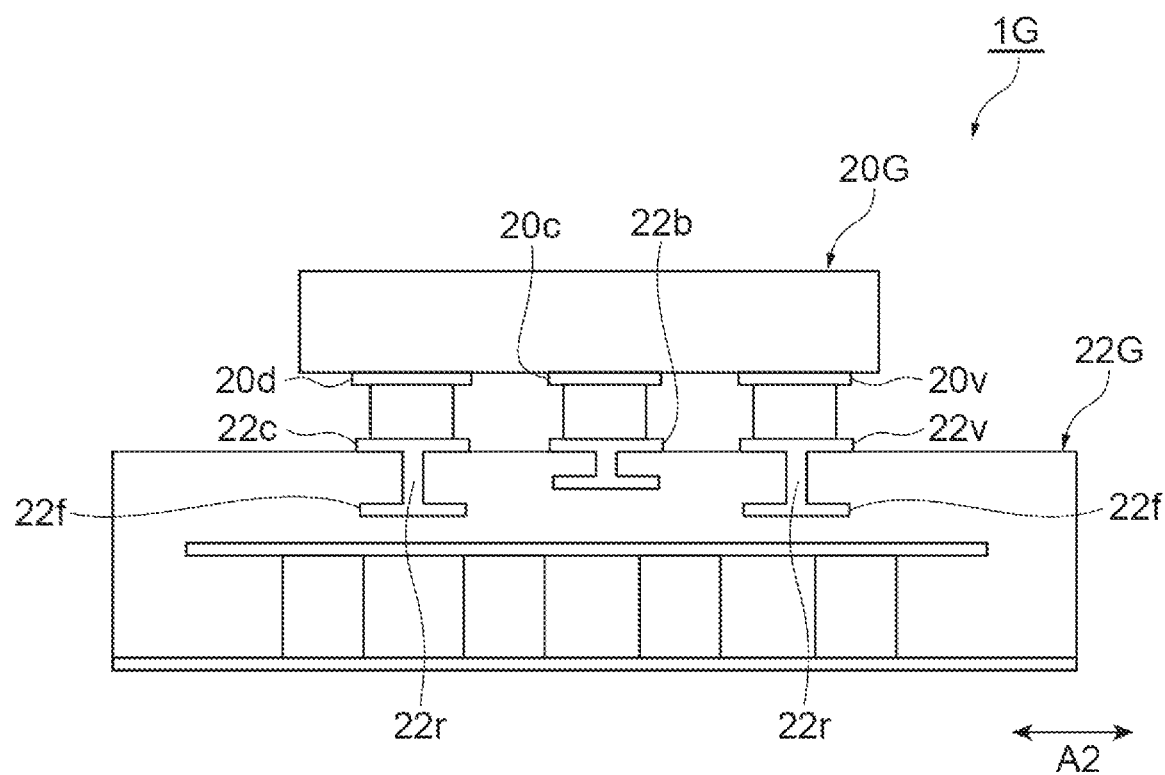
FIG. 21 is a schematic cross-sectional view of the transimpedance amplifier and the light-receiving element according to Example 5.

FIG. 20 illustrates a cross-sectional view of the light-receiving element 20G and the TIA 22G in the first direction A1 (line A1'-A1') of FIG. 19. FIG. 21 illustrates a cross-sectional view of the light-receiving element 20G and the TIA 22G in the second direction A2 (line A2'-A2') of FIG. 19. As illustrated in FIGS. 19 to 21, the TIA 22G is connected to the surface of the insulating layer 22j through the cathode wiring layer 22f and a via 22r (second via). A relay pad 22s is provided at a position corresponding to the cathode relay pad 20p of the light-receiving element 20G and to be spaced apart from each of the second pad 22c and the third pad 22v. The relay pad 22s of the TIA 22G is connected to the cathode relay pad 20p of the light-receiving element 20G through a pillar 29.

As described above, the light-receiving element 20G according to Example 5 may include the cathode relay pad 20p connected between the cathode electrode and the first cathode pad 20d through the cathode wiring pattern 20g. The TIA 22 has a relay pad 22s connected to the surface of the insulating layer 22j through the cathode wiring layer 22f and the via 22r, and arranged to be spaced apart from each of the second pad 22c and the third pad 22v at a position corresponding to the cathode relay pad 20p of the light-receiving element 20. The relay pad 22s of the TIA 22G may be connected to a cathode relay pad 20p of the light-receiving element 20 through the pillar 29.

Figure 22:
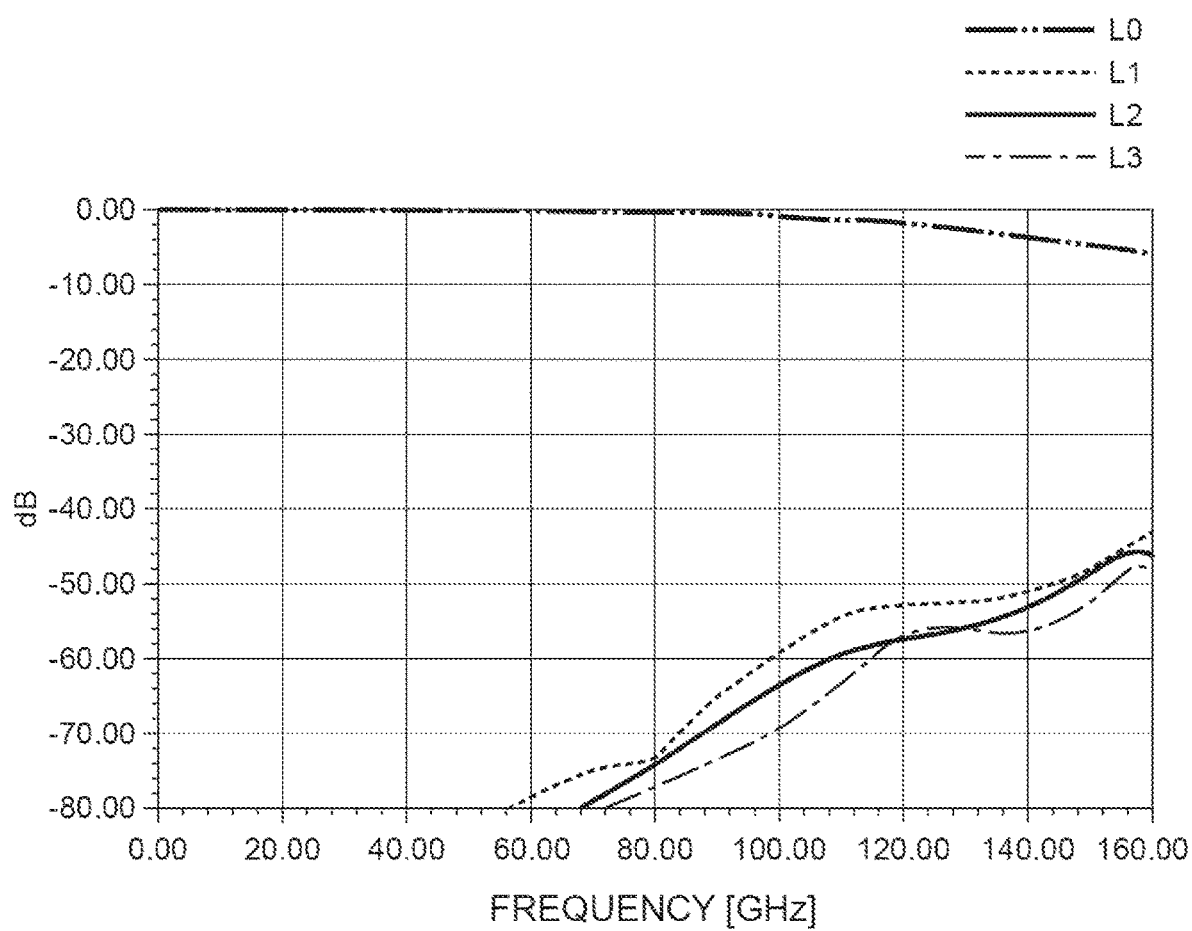
FIG. 22 is a graph illustrating resonance frequencies in the transimpedance amplifier and the light-receiving element of Example 5.

FIG. 22 is a graph illustrating the resonance frequency of the optical receiver 1G according to Example 5 for each channel. As illustrated in FIG. 22, it is found that, in the optical receiver 1G of Example 5, including the light-receiving element 20G and the TIA 22G which are connected to each other by four cathode pads, the resonance frequency can be further shifted to the high frequency side to reach about 160 GHz.

Various embodiments and various examples of the optical receivers according to the present disclosure have been described above. However, the invention is not limited to the embodiments described above. That is, it will be readily recognized by those skilled in the art that the invention can be modified and changed in various ways without departing from the scope of the claims. For example, the shape, size, number, material, and layout of each component of the optical receiver are not limited to those described above and can be changed as appropriate.

REFERENCE SIGNS LIST 1, 1C, 1D, 1E, 1F, 1G: optical receiver, 11: package, 11*a*, 11*aa*, 11*ab*: sidewall, 11*b*: bottom plate, 12: bush, 13: optical window, 14: optical axis converter, 14*b*: mirror, 15: optical demultiplexer, 16: lens, 17: feedthrough, 17*a*: terminal, 20, 20A, 20B, 20C, 20D, 20E, 20F, 20G: light-receiving element, 20*b*: face, 20*c*: anode pad (anode electrode), 20*d*: first cathode pad (cathode electrode), 20*f*: anode wiring pattern (anode wiring), 20*g*: cathode wiring pattern (cathode wiring), 20*h*: back surface side, 20*j*: back surface metal, 20*p*: cathode relay pad, 20*v*: second cathode pad (cathode electrode), 20*w*: cathode pad (cathode electrode), 21: substrate, 22, 22A, 22B, 22C, 22E, 22G: TIA (transimpedance amplifier), 22*b*: first pad, 22*c*: second pad, 22*d*: surface, 22*f*: cathode wiring layer, 22*g*: via (first via), 22*h*: ground layer, 22*j*: insulating layer, 22*k*: back surface ground, 22*m*: via, 22*p*: via, 22*q*: pad, 22*r*: via (second via), 22*s*: relay pad, 22*t*: via, 22*v*: third pad, 22*w*: pad, 24: capacitor, 25: pillar, 26: silver paste, 29: pillar, 30: substrate, 30*b*: pad, A1: first direction, A2: second direction, X: bonding wire.

What is claimed is:

1. An optical receiver comprising:
   a light-receiving element having an anode pad connected to an anode electrode through an anode wiring pattern and a first cathode pad and a second cathode pad connected to a cathode electrode through a cathode wiring pattern and arranged at positions interposing the anode pad; and
   a transimpedance amplifier including a cathode wiring layer supplying a cathode potential to the cathode pad of the light-receiving element, an insulating layer having the cathode wiring layer therein, a first pad provided on the insulating layer and connected to the anode pad of the light-receiving element, and a second pad connected to the first cathode pad of the light-receiving element and a third pad connected to the second cathode pad of the light-receiving element provided on the insulating layer, connected to the cathode wiring layer through a first via, and arranged at positions interposing the first pad,
   wherein the light-receiving element is connected to the anode pad mounted on the transimpedance amplifier and connected through the anode electrode and the anode wiring pattern provided on a surface facing the transimpedance amplifier and the first cathode pad and the second cathode pad connected through the cathode electrode and the cathode wiring pattern and arranged at positions interposing the anode pad,
   wherein the transimpedance amplifier further includes a ground layer connected to a reference potential, and
   wherein the ground layer of the transimpedance amplifier is connected to the cathode wiring layer of the transimpedance amplifier through a capacitor,
   further comprising a back surface ground provided on a back surface of the transimpedance amplifier and connected to a reference potential,
   wherein the ground layer of the transimpedance amplifier is provided on a back surface side of the cathode wiring layer and connected to the back surface ground through a TSV through silicon via) or a DSV (deep silicon via).

2. The optical receiver according to claim 1,
   wherein the first pad of the transimpedance amplifier is connected to the anode pad of the light-receiving element through a columnar member or a projection,
   wherein the second pad of the transimpedance amplifier is connected to the first cathode pad of the light-receiving element through a columnar member or a projection, and
   wherein the third pad of the transimpedance amplifier is connected to the second cathode pad of the light-receiving element through a columnar member or a projection.

3. The optical receiver according to claim 1,
   wherein the light-receiving element includes a cathode relay pad connected between the cathode electrode and the first cathode pad through the cathode wiring pattern,
   wherein the transimpedance amplifier includes a relay pad connected to a surface of the insulating layer through the cathode wiring layer and a second via and arranged to be spaced apart from each of the second pad and the third pad at positions corresponding to the cathode relay pads of the light-receiving element, and
   wherein the relay pad of the transimpedance amplifier is connected to the cathode relay pad of the light-receiving element through a first columnar member.

4. The optical receiver according to claim 1,
   wherein a back surface metal layer is provided on the back surface of the light-receiving element.

5. The optical receiver according to claim 1,
   wherein the cathode wiring layer surrounds the first pad, and
   wherein the cathode electrode and the cathode wiring are arranged on both sides of the anode electrode and the anode wiring.

6. The optical receiver according to claim 1,
   wherein the DSV is vias connected to the ground layer by from a highly doped substrate of the transimpedance amplifier to the insulating layer.

7. The optical receiver according to claim 1,
   wherein the TSV is vias connected to the ground layer from the back surface ground of the transimpedance amplifier.

* * * * *